(12) United States Patent
Noguchi

(10) Patent No.: US 11,653,442 B2
(45) Date of Patent: May 16, 2023

(54) OPTICAL MODULE AND METHOD FOR MANUFACTURING THE SAME

(71) Applicant: Lumentum Japan, Inc., Kanagawa (JP)

(72) Inventor: Daisuke Noguchi, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 57 days.

(21) Appl. No.: 17/447,824

(22) Filed: Sep. 16, 2021

(65) Prior Publication Data
US 2022/0007495 A1 Jan. 6, 2022

Related U.S. Application Data

(62) Division of application No. 16/737,354, filed on Jan. 8, 2020, now Pat. No. 11,134,563.

(30) Foreign Application Priority Data

Jan. 9, 2019 (JP) .............................. JP2019-001667

(51) Int. Cl.
*H05K 1/02* (2006.01)
*H05K 1/11* (2006.01)
(Continued)

(52) U.S. Cl.
CPC ............ *H05K 1/025* (2013.01); *H01R 12/62* (2013.01); *H05K 1/113* (2013.01); *H05K 1/118* (2013.01);
(Continued)

(58) Field of Classification Search
CPC . H05K 1/02; H05K 1/025; H05K 1/11; H05K 1/18; H05K 1/111; H05K 1/112;
(Continued)

(56) References Cited

U.S. PATENT DOCUMENTS 9,544,059 B2 1/2017 Goto
10,231,327 B1 * 3/2019 Murakami ............. H05K 1/189
(Continued)

FOREIGN PATENT DOCUMENTS

| CN | 206452600 U | 8/2017 |
| JP | 2004247980 A | 9/2004 |
| JP | 2007243536 A | 9/2007 |
| JP | 2011100769 A | 5/2011 |
| JP | 2016072514 A | 5/2016 |

*Primary Examiner* — Xiaoliang Chen
(74) *Attorney, Agent, or Firm* — Harrity & Harrity, LLP

(57) ABSTRACT

A printed circuit board includes a first transmission line provided on an insulating base, a first ground conductor, a notch portion that exposes a part of the first ground conductor, a conductor provided in the notch portion and electrically connected to the first ground conductor, and a first electrode exposed on a main surface of the insulating base facing a flexible board and electrically connected to the first transmission line. The flexible board includes a second transmission line provided on an insulating sheet, a second ground conductor, a second electrode exposed on a main surface of the insulating sheet facing the printed circuit board and connected to the second transmission line, and a third electrode exposed on the main surface of the insulating sheet and connected to the second ground conductor. The conductor and the third electrode are connected by solder.

20 Claims, 13 Drawing Sheets

(51) Int. Cl.
*H05K 1/18* (2006.01)
*H05K 3/34* (2006.01)
*H01R 12/62* (2011.01)
*H01R 12/88* (2011.01)
*H04B 10/50* (2013.01)
*H04B 10/60* (2013.01)
*H04B 10/516* (2013.01)
*H05K 3/36* (2006.01)

(52) U.S. Cl.
CPC ............ *H05K 3/363* (2013.01); *H04B 10/50* (2013.01); *H04B 10/60* (2013.01); *H05K 2201/0919* (2013.01)

(58) Field of Classification Search
CPC ........ H05K 1/113; H05K 1/117; H05K 1/118; H05K 1/147; H05K 1/189; H05K 3/34; H05K 3/363; H01R 12/62; H01R 12/88; H01R 12/592; H01R 12/732; H04B 10/50; H04B 10/60; H04B 10/501; H04B 10/516
USPC ..................... 361/749, 826; 174/254; 385/92
See application file for complete search history.

(56) References Cited

U.S. PATENT DOCUMENTS

| | | |
|---|---|---|
| 11,134,563 B2 | 9/2021 | Noguchi |
| 2003/0063872 A1 | 4/2003 | Govan Date et al. |
| 2003/0085054 A1* | 5/2003 | Ames .................... H01R 12/62 174/254 |
| 2003/0112617 A1 | 6/2003 | Ueno et al. |
| 2003/0142929 A1 | 7/2003 | Bartur et al. |
| 2006/0082422 A1 | 4/2006 | Yagyu et al. |
| 2007/0058980 A1* | 3/2007 | Hidaka ................ G02B 6/4279 398/138 |
| 2013/0201620 A1* | 8/2013 | Schlaupitz ............ H01R 12/62 439/708 |
| 2015/0156885 A1* | 6/2015 | Ono ...................... H05K 1/118 228/256 |
| 2016/0204532 A1* | 7/2016 | Ishida .................... H05K 1/117 174/251 |
| 2016/0211599 A1* | 7/2016 | Ishida ................. H01R 12/732 |
| 2017/0093059 A1 | 3/2017 | Chen et al. |
| 2017/0104542 A1* | 4/2017 | Sugiyama ............ H05K 1/0228 |
| 2017/0168255 A1* | 6/2017 | Komatsu ................ H05K 1/111 |
| 2017/0358847 A1* | 12/2017 | Cho ...................... H05K 1/0218 |
| 2018/0172932 A1 | 6/2018 | Noguchi et al. |

* cited by examiner

EXTENDING DIRECTION
OF FLEXIBLE BOARD

OPTICAL MODULE AND METHOD FOR MANUFACTURING THE SAME

CROSS-REFERENCE TO RELATED APPLICATIONS

This application is a divisional of U.S. patent application Ser. No. 16/737,354, filed Jan. 8, 2020 (now U.S. Pat. No. 11,134,563), which claims priority to Japanese application JP 2019-001667, filed on Jan. 9, 2019, which are both incorporated herein by reference in their entireties.

TECHNICAL FIELD

The present disclosure relates to an optical module and a manufacturing method for an optical module.

BACKGROUND

Currently, most of the Internet and telephone networks are constructed by optical communication networks. Optical modules used as interfaces for routers/switches and transmission devices that are optical communication devices have an important role in converting electrical signals into optical signals. In general, an optical module includes an optical subassembly containing an optical element, a printed circuit board mounted with an IC for processing a signal including a modulated electric signal, and a flexible printed board electrically connected therebetween.

An optical subassembly may include a ground conductor on the end surface of a transmission line so that one component is orthogonal to the signal wiring of the transmission line, and the upper surface of the ground conductor and the lower surface of a ground conductor disposed on the lower surface of the other component are connected by solder. With such an optical subassembly, part of the high-frequency signal may be suppressed from being radiated into the air from the transmission line, and signal transmission characteristics in a high-frequency band are improved.

SUMMARY

According to some possible implementations, an optical module may include: a printed circuit board; and a flexible board. The printed circuit board may include an insulating base, a first transmission line provided on the insulating base, a first ground conductor disposed in the insulating base, a notch portion formed on a side surface of the insulating base such that the first ground conductor is partially exposed, a conductor provided in the notch portion and electrically connected to the first ground conductor, and a first electrode exposed on a main surface of the insulating base facing the flexible board and electrically connected to the first transmission line. The flexible board may include an insulating sheet including a plurality of insulating layers, a second transmission line provided on the insulating sheet, a second ground conductor disposed in the insulating sheet, a second electrode exposed on a main surface of the insulating sheet facing the printed circuit board and connected to the second transmission line, and a third electrode exposed on the main surface of the insulating sheet facing the printed circuit board and connected to the second ground conductor. The first electrode and the second electrode may be electrically connected, and the conductor and the third electrode may be connected by solder.

According to some possible implementations, a method for manufacturing an optical module may include: preparing an in-process printed circuit board including: an insulating base, a first transmission line provided on the insulating base, a first ground conductor disposed in the insulating base, and a first electrode exposed on a main surface of the insulating base facing the flexible board and electrically connected to the first transmission line; forming a notch portion on a side surface of the insulating base such that the first ground conductor is partially exposed from the side surface; forming a conductor electrically connected to the first ground conductor at the notch portion; preparing a flexible board including: an insulating sheet including a plurality of insulating layers, a second transmission line provided on the insulating sheet, a second ground conductor disposed in the insulating sheet, a second electrode exposed on a main surface of the insulating sheet facing the printed circuit board and connected to the second transmission line, and a third electrode exposed on the main surface of the insulating sheet facing the printed circuit board and connected to the second ground conductor; disposing the flexible board and the printed circuit board so that at least a part of the third electrode overlaps at least a part of a region surrounded by the conductor and the side surface when viewed from a direction orthogonal to the main surface of the insulating base; and applying solder from the conductor to the electrode.

DETAILED DESCRIPTION

The following detailed description of example implementations refers to the accompanying drawings. The same reference numbers in different drawings may identify the same or similar elements.

Figure 1:
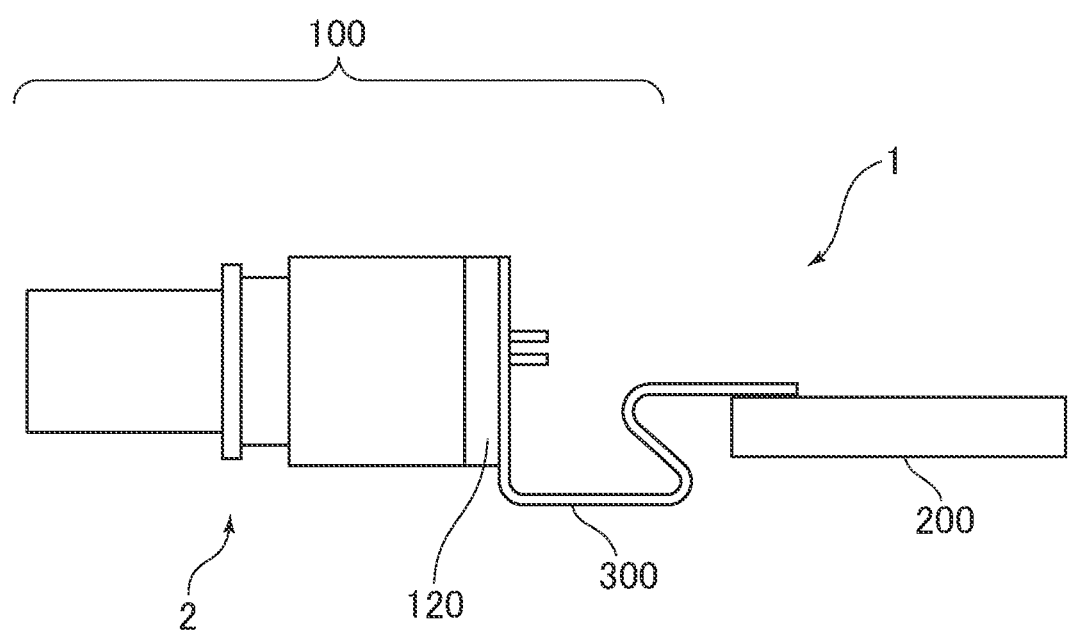
FIG. 1 is an external view of an optical module.

FIG. 1 is an external view of an optical module 1 for optical communication in the present implementation. A modulated electric signal is transmitted to an optical subassembly 100 via a flexible board 300 connected to a printed circuit board 200 by solder or the like from a driving IC (not shown) mounted on the printed circuit board 200. The optical subassembly 100 contains an optical element and includes an interface that transmits and receives outgoing light or incident light. The optical subassembly 100 includes an eyelet 120 and an optical receptacle 2. Although not shown, the optical subassembly 100, the printed circuit board 200, and the flexible board 300 are built in a housing made of metal or the like to constitute the optical module 1.

Examples of the optical subassembly 100 include a transmitter optical subassembly (TOSA) that has a light-emitting element such as a laser diode therein, converts an electrical signal into an optical signal, and transmits the optical signal, a receiver optical subassembly (ROSA) that has a light-receiving element such as a photodiode therein and converts the received optical signal into an electrical signal, a bidirectional optical subassembly (BOSA) that has both of these functions, and the like. The present implementation can be applied to any of the above optical subassemblies, and in the present implementation, a transmitter optical subassembly will be described as an example.

Figure 2:
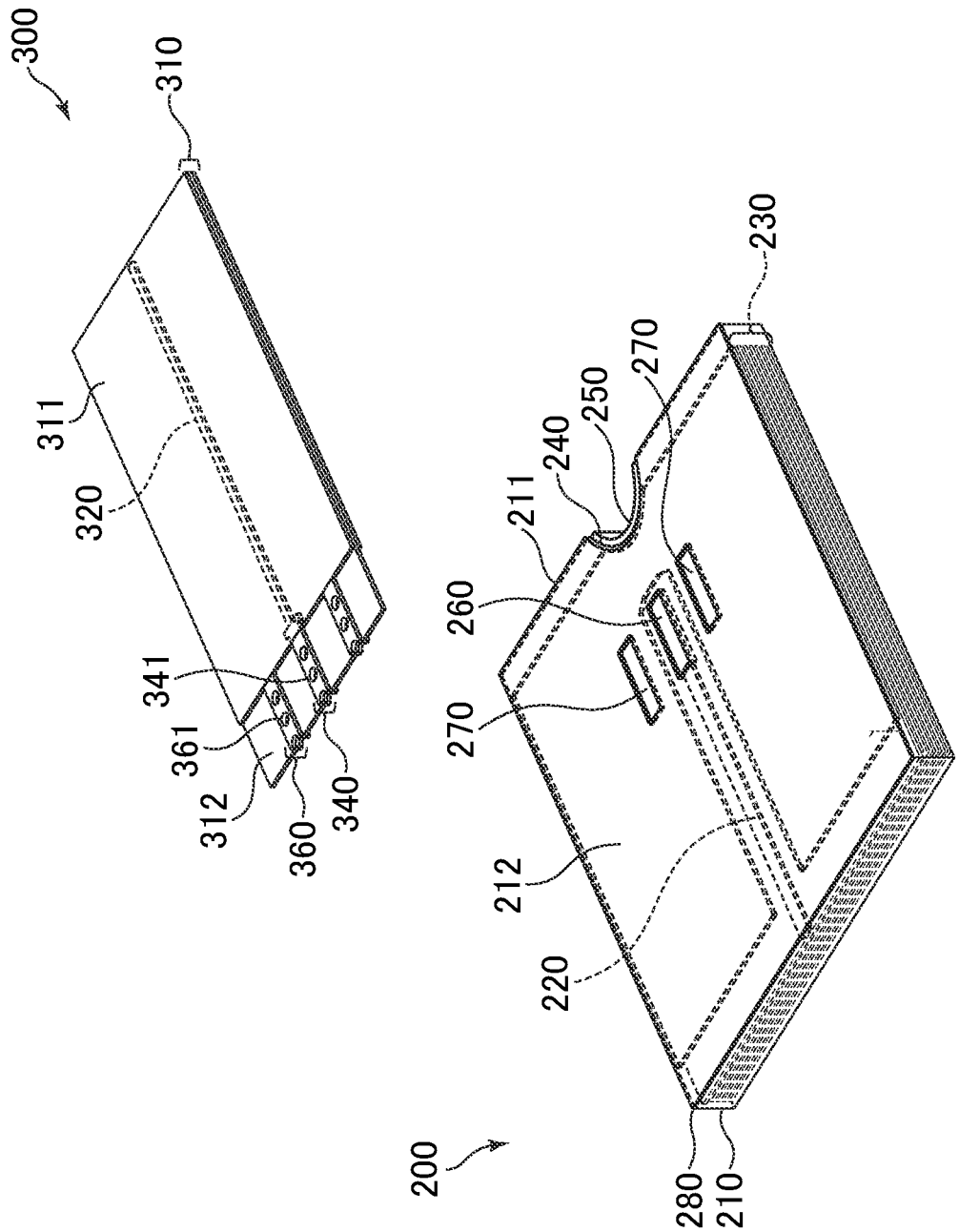
FIG. 2 is a perspective view showing a state before a printed circuit board and a flexible board are connected.
Figure 3:
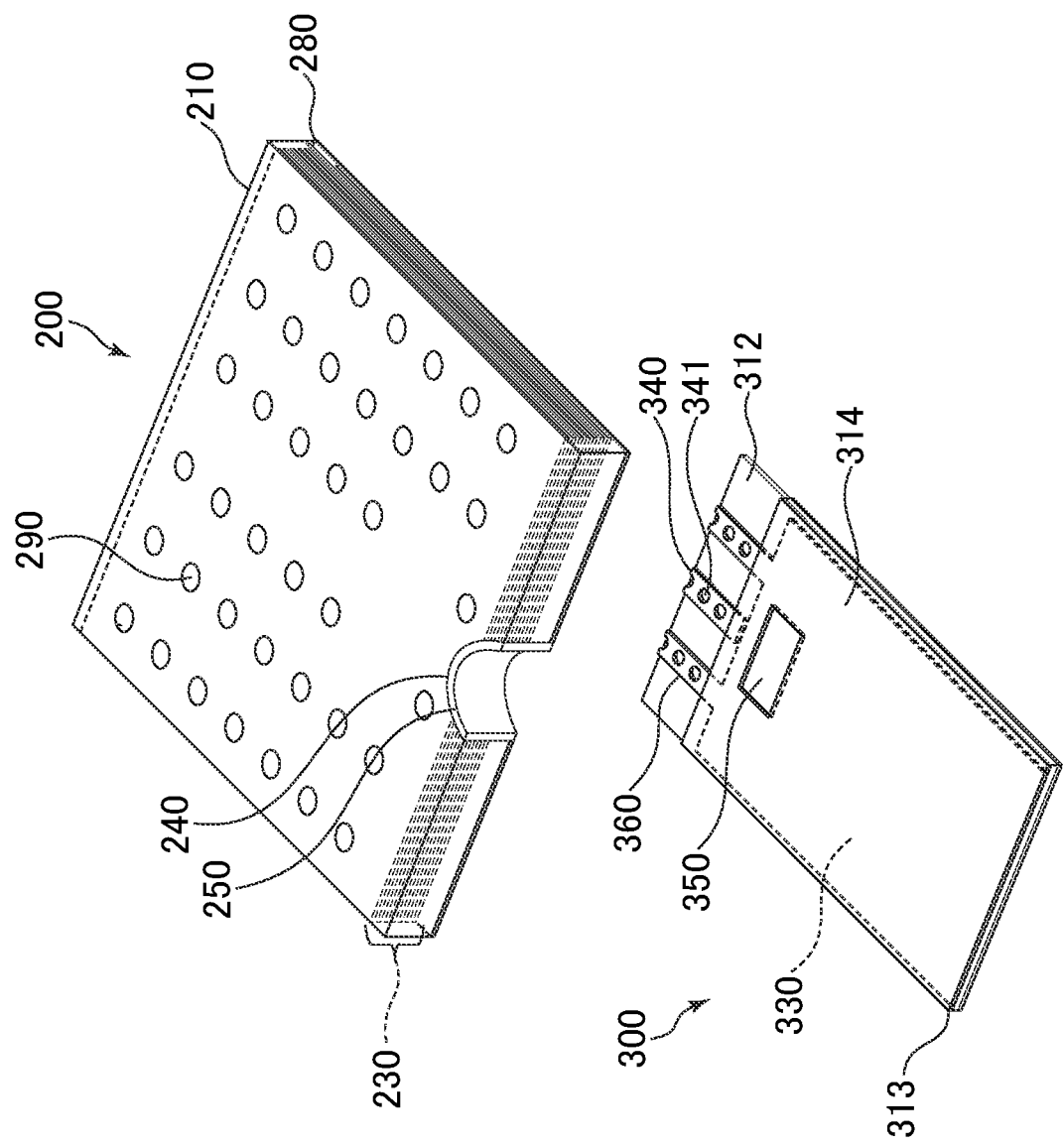
FIG. 3 is a perspective view showing a state before the printed circuit board and the flexible board are connected.

FIG. 2 is a perspective view showing a state before the printed circuit board 200 and the flexible board 300 according to the present implementation are connected, when viewed from above. FIG. 3 is a perspective view showing a state before the printed circuit board 200 and the flexible board 300 according to the present implementation are connected, when viewed from below.

As shown in FIGS. 2 and 3, the printed circuit board 200 includes an insulating base 210, a first transmission line 220, a first ground conductor 230, a notch portion 240, a conductor 250, and a first electrode 260.

The first transmission line 220 that transmits an electrical signal to an optical element provided in the optical subassembly 100 is provided on the insulating base 210. In FIGS. 2 and 3, the first ground conductor 230 includes a plurality of ground conductors and is disposed in the insulating base 210. The notch portion 240 is formed on a side surface 211 of the insulating base 210 such that the first ground conductor 230 is partially exposed. The notch portion 240 is formed with the conductor 250 electrically connected to the first ground conductor. The notch portion 240 and the conductor 250 constitute a castellation. The first electrode 260 is exposed on a main surface 212 (upper surface in FIG. 2) of the insulating base 210 facing the flexible board 300. The first electrode 260 is electrically connected to the first transmission line 220. In FIG. 2, a resist 280 is applied to the upper surfaces of the insulating base 210 and the first transmission line 220. The resist 280 has a plurality of openings, and a part of the first transmission line 220 exposed from one of the openings is used as the first electrode 260.

As shown in FIGS. 2 and 3, the flexible board 300 includes an insulating sheet 310, a second transmission line 320, a second ground conductor 330, a second electrode 340, and a third electrode 350.

The insulating sheet 310 includes a plurality of insulating layers. The insulating sheet 310 is provided with the second transmission line 320 that transmits an electrical signal to an optical element provided in the optical subassembly 100. In FIG. 2, the second transmission line 320 is provided between the insulating layer 311 and the insulating layer 312. The second ground conductor 330 is disposed in the insulating sheet 310, and is provided between the insulating layer 312 and the insulating layer 313 in FIG. 3. The second electrode 340 is exposed on at least a main surface 314 of the insulating sheet 310 facing the printed circuit board 200. The second electrode 340 is connected to the second transmission line 320 as shown in FIG. 2. In FIGS. 2 and 3, the second electrode 340 has a configuration in which two electrodes sandwich an insulating layer 312 and the two electrodes are electrically connected by solder filling a via 341. The third electrode 350 is exposed on the main surface 314 of the insulating sheet 310. The third electrode 350 is connected to the second ground conductor 330. In FIG. 3, the insulating layer 313 that is the outermost layer included in the insulating sheet 310 has an opening, and a part of the second ground conductor 330 exposed from the opening is used as the third electrode 350.

Figure 4:
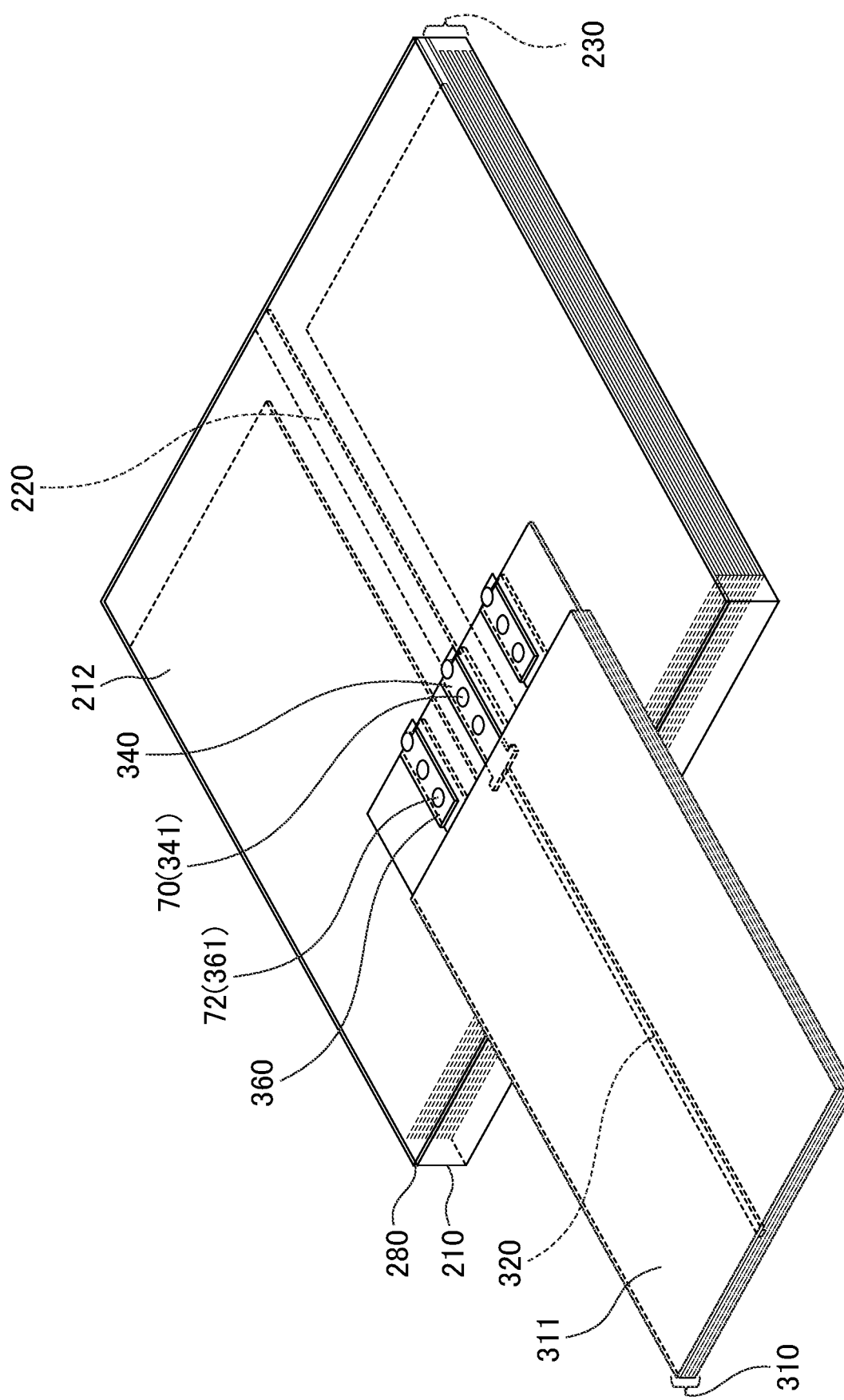
FIG. 4 is a perspective view showing a state in which the printed circuit board and the flexible board are connected.
Figure 5:
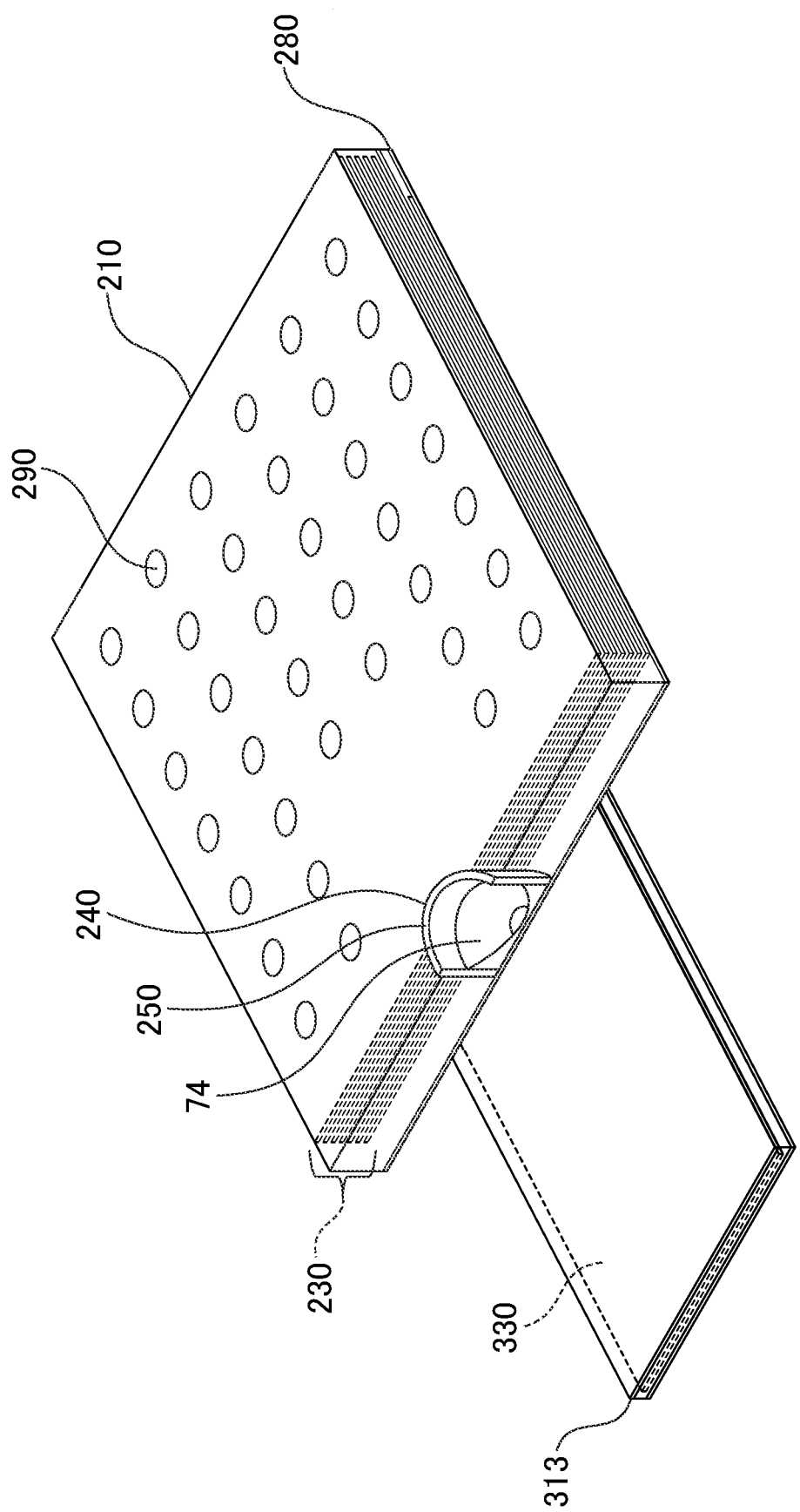
FIG. 5 is a perspective view showing a state in which the printed circuit board and the flexible board are connected.

FIG. 4 is a perspective view showing a state in which the printed circuit board 200 and the flexible board 300 according to the present implementation are connected, when viewed from above. FIG. 5 is a perspective view showing a state in which the printed circuit board 200 and the flexible board 300 according to the present implementation are connected, when viewed from below.

As shown in FIG. 4, the first electrode 260 (see FIG. 2) electrically connected to the first transmission line 220 provided on the printed circuit board 200 and the second electrode 340 (see FIG. 3) connected to the second transmission line 320 provided on the flexible board 300 are electrically connected by solder 70 filling the via 341 provided in the second electrode 340. As shown in FIG. 5, the conductor 250 formed in the notch portion 240 provided in the printed circuit board 200 and electrically connected to the first ground conductor 230 and the third electrode 350 (see FIG. 3) connected to the second ground conductor 330 provided on the flexible board 300 are connected by solder 74 applied from the conductor 250 to the third electrode 350.

The above-mentioned configuration of the printed circuit board 200 and the flexible board 300 can improve the reliability of ground connection between the printed circuit board 200 and the flexible board 300. That is, in the configuration of the present implementation, when the conductor 250 connected to the first ground conductor 230 in the printed circuit board 200 and the third electrode 350 connected to the second ground conductor 330 of the flexible board 300 are electrically connected by the solder 74, the connection portion can be visually recognized from the outside. Therefore, the reliability of ground connection between the printed circuit board 200 and the flexible board 300 can be improved.

Further, in FIG. 2, the printed circuit board 200 includes two fourth electrodes 270 connected to the first ground conductor 230. In FIG. 2, the resist 280 has a plurality of openings, and a part of the first ground conductor 230 exposed from two of the openings is used as the fourth electrode 270. That is, the resist 280 formed on the upper surface of the insulating base 210 of the printed circuit board 200 is not applied to the first electrode 260 and the fourth electrode 270, and the first electrode 260 and the fourth electrode 270 are exposed from the resist 280. Due to the presence of the resist 280, the solder applied to the first electrode 260 and the fourth electrode 270 can be prevented from flowing in the direction of the main surface 212 of the insulating base 210.

In FIGS. 2 and 3, the flexible board 300 includes two fifth electrodes 360 connected to the second ground conductor 330. The fifth electrode 360 has a configuration in which two electrodes sandwich the insulating layer 312 and the two electrodes are electrically connected by solder filling a via 361.

As shown in FIG. 2, the fourth electrode 270 provided on the printed circuit board 200 and the fifth electrode 360 provided on the flexible board 300 are electrically connected by solder 72 filling the via 361 provided in the fifth electrode 360 as shown in FIG. 4. Such a configuration can further strengthen the ground connection between the printed circuit board 200 and the flexible board 300.

An optical module is enhanced in speed and reduced in size and cost with the spread of broadband networks in recent years. In order to reduce the size of the optical module 1, not only the optical subassembly 100 included in the optical module 1 but also the IC and the printed circuit board 200 are required to be reduced. In order to reduce the size of the IC, recent IC packages are offered as ball grid array (BGA) types, and the ball-shaped terminals at that time are arranged at a pitch of approximately 0.5 mm. Furthermore, high-density mounting is realized by adopting a full grid configuration in which all of grids on a terminal mounting surface are filled with terminals.

However, since it is difficult to pass the wiring between terminals of 0.5 mm, among the terminals disposed in a grid pattern, it is necessary to connect the printed circuit board 200 to the terminals disposed inside the second and subsequent rows of the grid by using wiring extending between a plurality of insulating layers constituting the insulating base 210 of the printed circuit board 200.

Here, since the land diameter increases and interference occurs between adjacent terminals in the case of forming a via in the IC with a drill, it is difficult to wire the inner terminals of the second and subsequent rows in the full grid. Therefore, it is desirable to form a via by using a laser in order to reduce the land diameter. All the terminals of the full grid provided in the IC can be connected to the wiring extending between the plurality of insulating layers in the printed circuit board 200. Therefore, the material of the insulating base 210 constituting the printed circuit board 200 receives restrictions such as laser output and cost, and thus the base thickness, the dielectric constant, the dielectric loss tangent, and the like are naturally determined. The printed circuit board 200 includes the first ground conductor 230 composed of a plurality of ground conductors in order to enable high-density mounting. As shown in FIG. 5, the plurality of ground conductors included in the first ground conductor 230 are electrically connected to each other by a plurality of vias 290 that penetrate the printed circuit board 200.

In recent years, a demand for optical modules capable of transmitting high-speed electrical signals of 50 Gbit/s has been increasing due to high speed requirements. Under such high-speed transmission, in the case of connecting the printed circuit board 200 including the first ground conductor 230 composed of a plurality of ground conductors to the optical subassembly 100 by using the solder or the like via the flexible board 300, the ground resonance at the connection point between the printed circuit board 200 and the flexible board 300 becomes large, and the waveform quality of the optical module 1 may be deteriorated. That is, at the connection portion between the printed circuit board 200 and the flexible board 300, the signal wiring of the flexible board 300 may serve as an excitation source and induce parallel plate resonance.

However, as shown in FIGS. 4 and 5, in the optical module 1 according to the present implementation, the first ground conductor 230 of the printed circuit board 200 and the second ground conductor 330 of the flexible board 300 are connected by the shortest path by using the solder 74, and therefore the delay of the return current can be suppressed and the occurrence of the parallel plate resonance phenomenon can be suppressed.

Figure 6:
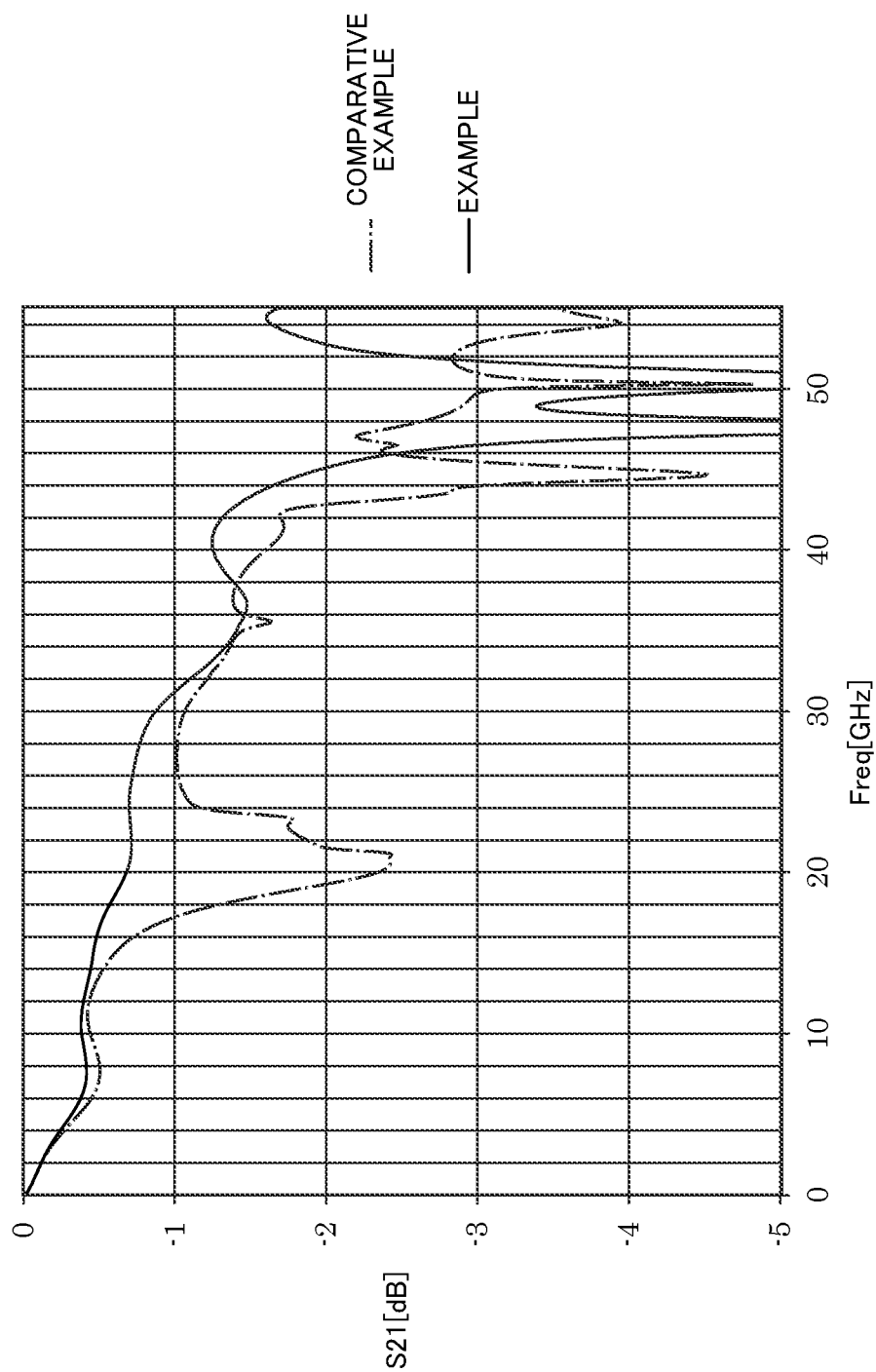
FIG. 6 is a graph obtained by calculating transmission characteristics from the printed circuit board to the flexible board by using a high frequency structure simulator (HFSS) as a three-dimensional electromagnetic field simulator, according to an example and a comparative example.

FIG. 6 is a graph obtained by calculating the transmission characteristics from the printed circuit board 200 to the flexible board 300 by using a high frequency structure simulator (HFSS) as a three-dimensional electromagnetic field simulator, according to an example and a comparative example of the present implementation. The graph of the example shown in FIG. 6 shows the transmission characteristics in a state where the printed circuit board 200 includes the notch portion 240 and the conductor 250, and the conductor 250 and the third electrode 350 (see FIG. 3) of the flexible board 300 are connected by the solder 74 as shown in FIGS. 4 and 5. The graph of the comparative example shown in FIG. 6 shows the transmission characteristics in a state where the printed circuit board 200 does not include the conductor 250. That is, the connection between the ground conductors of the printed circuit board 200 and the flexible board 300 in the comparative example is only the connection between the fourth electrode 270 of the printed circuit board 200 and the fifth electrode 360 of the flexible board 300.

As shown in FIG. 6, compared with the graph of the comparative example, in the graph of the example, since the first ground conductor 230 of the printed circuit board 200 and the second ground conductor 330 of the flexible board 300 are connected by the shortest path by using the solder 74, it is understood that the deterioration of the transmission characteristics due to the parallel plate resonance phenomenon is suppressed.

As long as the occurrence of this parallel plate resonance phenomenon is to be suppressed, a through-hole penetrating the printed circuit board 200 may be provided, and the first ground conductor 230 and the second ground conductor 330 may be connected via the through-hole. In contrast, in the present implementation, as described above, the notch portion 240 is provided in the side surface 211 of the printed circuit board 200, and the conductor 250 connected to the first ground conductor is formed in the notch portion 240. With such a configuration, when the conductor 250 connected to the first ground conductor 230 and the third electrode 350 connected to the second ground conductor 330 are electrically connected by the solder 74, the connection portion can be visually recognized from the outside. As a result, the reliability of ground connection between the printed circuit board 200 and the flexible board 300 can be improved. As shown in FIG. 1, the flexible board 300 is often stored in the optical module 1 in a bent state. Therefore, the flexible board 300 may be peeled off from the printed circuit board 200, for example, upward in FIG. 1. Since the solder 72 remains only in the exposed region of each electrode at the connection point between the fourth electrode 270 of the printed circuit board 200 and the fifth electrode 360 of the flexible board 300, a sufficient amount of solder may not be supplied and sufficient connection strength may not be obtained. However, since the solder 74 can be supplied to a region wide to some extent by connecting the conductor 250 connected to the first ground conductor 230 and the third electrode 350 connected to the second ground conductor 330 by the solder 74 provided in the notch portion 240, sufficient connection strength can be obtained, and an effect of suppressing the flexible board 300 from being peeled off from the printed circuit board 200 can be obtained. That is, not only the connection reliability at the time of manufacturing but also the connection reliability from a long-term viewpoint can be ensured. Furthermore, rather than simply connecting to the ground at the side of the printed circuit board 200, the notch 240 is provided and the ground connection is made thereat, whereby the effect that the solder 74 remains in the vicinity of the connection point can be obtained. In a case where the notch portion 240 is not provided, that is, in a case where the conductor is provided on the entire side of the printed circuit board 200, since the solder spreads over the entire side, the solder may not remain at the connection point between the printed circuit board 200 and the flexible board 300, the solder may be insufficient at the connection portion, and the necessary connection strength may not be obtained. This problem may be solved by providing the notch portion 240. It is possible to secure a component mounting region on the printed circuit board 200 by providing the notch portion 240 and the conductor 250 rather than forming a through-hole penetrating the printed circuit board 200. Therefore, according to the configuration of the present implementation, it is possible to strengthen the ground connection between the printed circuit board 200 and the flexible board 300 while expanding the component mounting region in the printed circuit board 200, and it is also possible to improve the visibility of the ground connection portion of the printed circuit board 200 and the flexible board 300.

Figure 7:
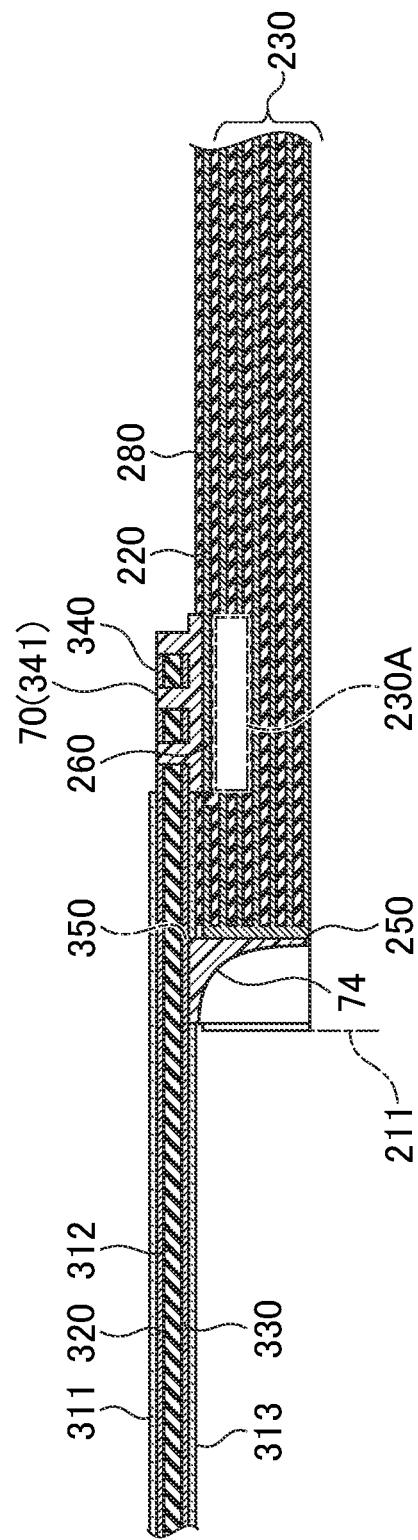
FIG. 7 is a schematic view showing a cross-sectional structure of a first transmission line and a center line of a second transmission line.

FIG. 7 is a schematic view showing a cross-sectional structure of the first transmission line 220 and the center line of the second transmission line 320. As shown in FIG. 7, since the conductor 250 provided on the side surface 211 of the printed circuit board 200, and the third electrode 350 of the flexible board 300 are orthogonal to each other, fillets are easily formed, and the strength of the connection portion between the printed circuit board 200 and the flexible board 300 can be improved.

Figure 8:
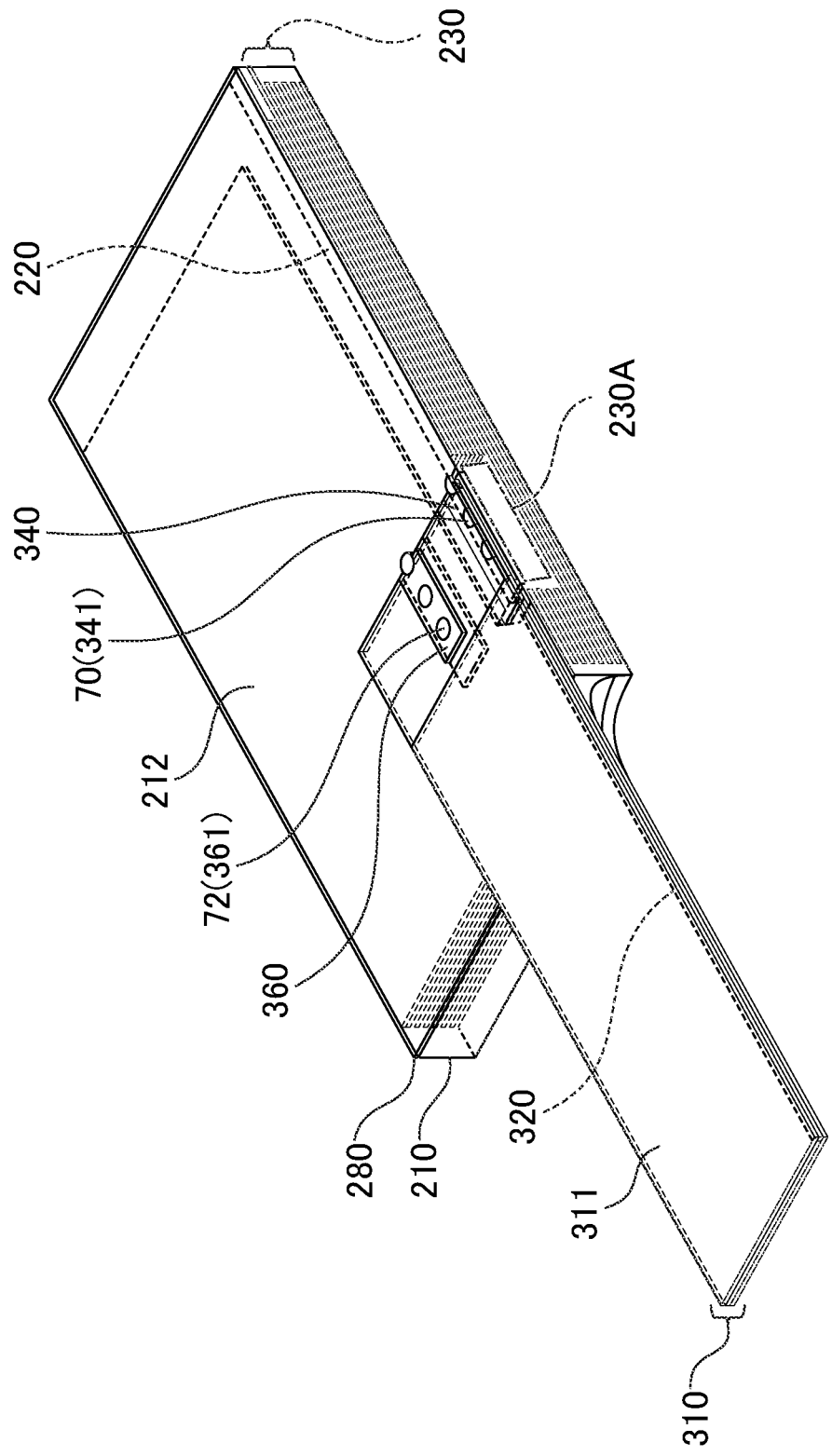
FIG. 8 is a schematic perspective view showing a cross-sectional structure of the first transmission line and the center line of the second transmission line.

FIG. 8 is a schematic perspective view showing a cross-sectional structure of the first transmission line 220 and the center line of the second transmission line 320. As shown in FIGS. 7 and 8, the optical module 1 according to the present implementation is configured such that the first ground conductor 230 has an opening 230A at a position overlapping the first electrode 260 when viewed from the direction orthogonal to the main surface 212 of the insulating base 210. Such a configuration can further improve the accuracy of impedance matching. For example, even in a case where displacement occurs between the first electrode 260 of the printed circuit board 200 and the second electrode 340 of the flexible board 300 in the manufacturing process, in order to reduce the change in the contact area between the first electrode 260 and the second electrode 340, the width (length in the direction perpendicular to the extending direction of the first transmission line 220) of the first electrode 260 is made larger than the width of the first transmission line 220 as shown in FIG. 2. For this reason, the impedance decreases as the area of the first electrode 260 increases. With respect to this problem, as shown in FIGS. 7 and 8, the first ground conductor 230 has the opening 230A at a position overlapping the first electrode 260 when viewed from the direction orthogonal to the main surface 212 of the insulating base 210, thereby making it possible to adjust impedance and perform impedance matching.

Figure 9:
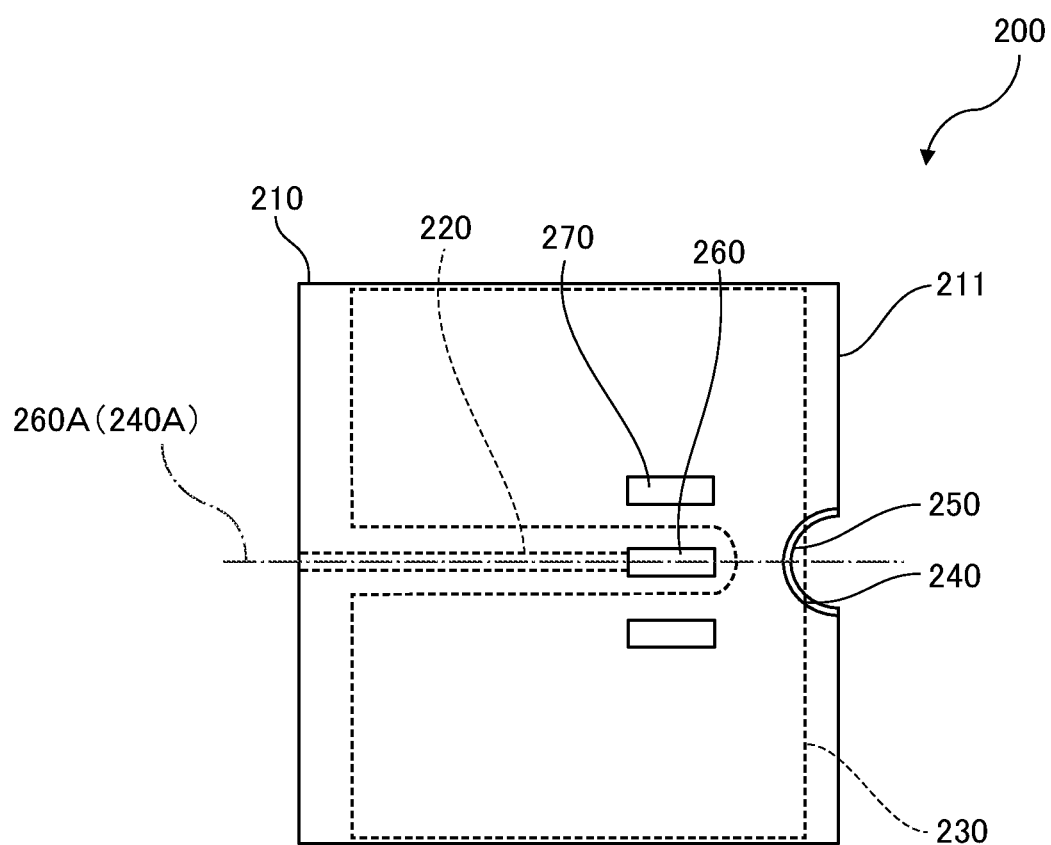
FIG. 9 is a schematic plan view of the printed circuit board.
Figure 10:
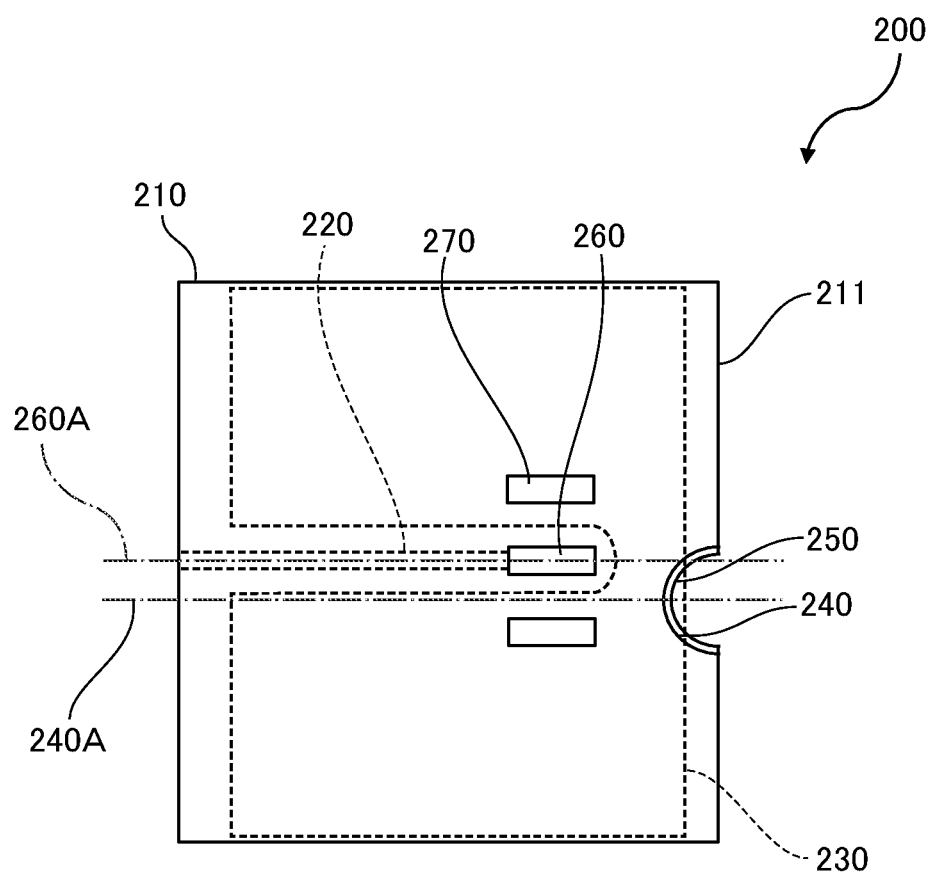
FIG. 10 is a schematic plan view of a printed circuit board according to another example.
Figure 11:
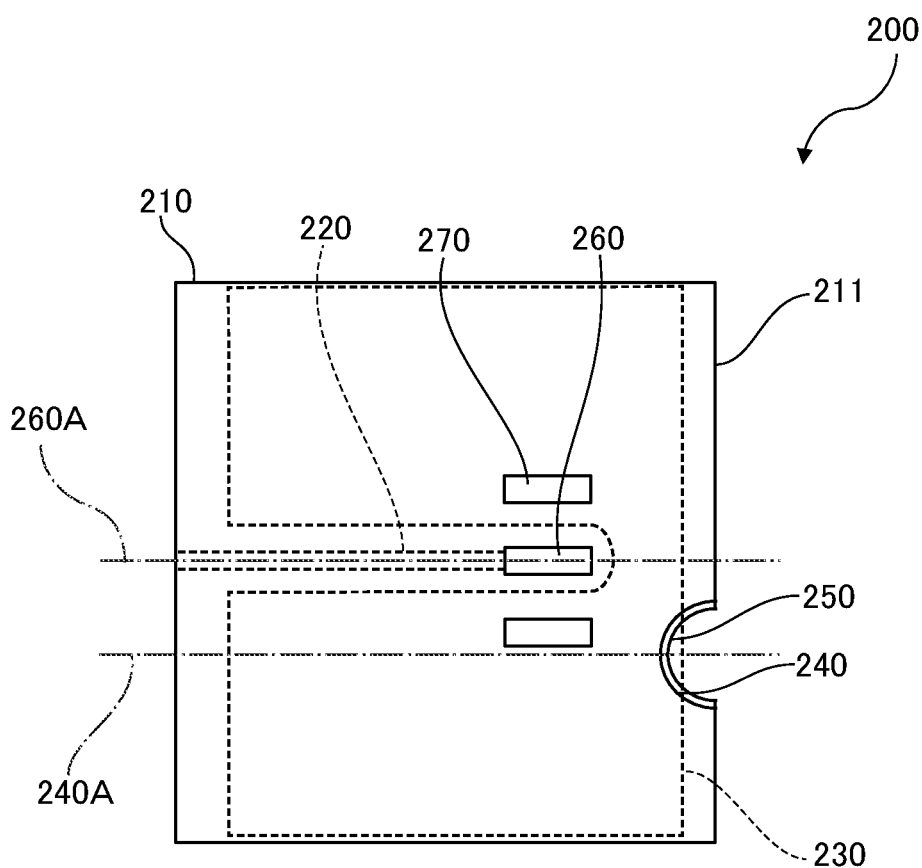
FIG. 11 is a schematic plan view of a printed circuit board according to another example.
Figure 12:
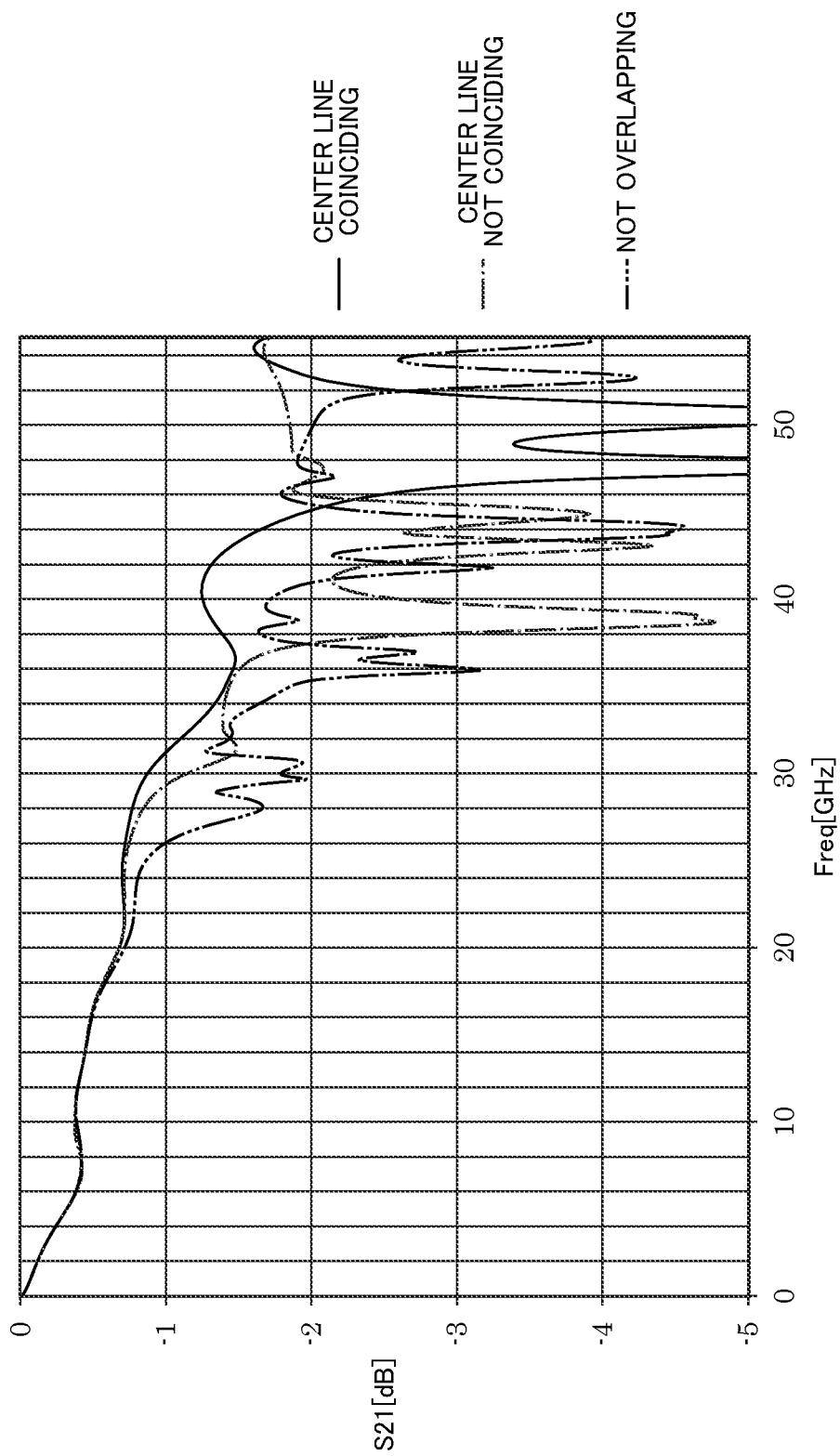
FIG. 12 is a graph obtained by calculating transmission characteristics from the printed circuit board to the flexible board by using a high frequency structure simulator (HFSS) as the three-dimensional electromagnetic field simulator.

FIGS. 9, 10, and 11 are schematic plan views of the printed circuit board 200 according to the present implementation. FIG. 12 is a graph obtained by calculating the transmission characteristics from the printed circuit board 200 to the flexible board 300 for the configurations according to FIGS. 9, 10, and 11 by using a high frequency structure simulator (HFSS) as a three-dimensional electromagnetic field simulator.

In the configuration shown in FIG. 9, a center line 260A of the first electrode 260 overlaps the notch portion 240 when viewed from the direction orthogonal to the main surface 212 of the insulating base 210. In the configuration shown in FIG. 9, a center line 240A of the notch portion 240 and the center line 260A of the first electrode 260 coincide with each other when viewed from the direction orthogonal to the main surface 212 of the insulating base 210. Here, the center line 260A of the first electrode 260 means a straight line parallel to the extending direction of the first transmission line 220 and passing through the center position of the first electrode 260 in the direction orthogonal to the extending direction. The center line 240A of the notch portion 240 means a straight line parallel to the extending direction of the first transmission line 220 and passing through the center position of the notch portion 240 in the direction orthogonal to the extending direction.

In the configuration shown in FIG. 10, the center line 260A of the first electrode 260 overlaps the notch portion 240 when viewed from the direction orthogonal to the main surface 212 of the insulating base 210. In the configuration shown in FIG. 10, the center line 240A of the notch portion 240 and the center line 260A of the first electrode 260 do not coincide with each other when viewed from the direction orthogonal to the main surface 212 of the insulating base 210.

In the configuration shown in FIG. 11, the center line 260A of the first electrode 260 does not overlap the notch portion 240 when viewed from the direction orthogonal to the main surface 212 of the insulating base 210. In the configuration shown in FIG. 11, the center line 240A of the notch portion 240 and the center line 260A of the first electrode 260 do not coincide with each other when viewed from the direction orthogonal to the main surface 212 of the insulating base 210.

In FIG. 12, the transmission characteristics for the configuration shown in FIG. 9 are displayed as "center line coinciding". The transmission characteristics for the configuration shown in FIG. 10 are displayed as "center line not coinciding". The transmission characteristics for the configuration shown in FIG. 11 are displayed as "not overlapping".

As shown in FIG. 12, it is understood that in the transmission characteristics according to the configurations shown in FIGS. 9 and 10, dip is less and stable transmission can be performed, compared with the transmission characteristics according to the configuration shown in FIG. 11. In particular, in order to perform transmission of 50 Gbit/s, it is necessary to perform stable transmission up to 35 GHz. The configurations shown in FIGS. 9 and 10 are desirable because the transmission characteristics do not have a large dip even in the vicinity of 35 GHz. Accordingly, as shown in FIGS. 9 and 10, it is desirable that the center line 260A of the first electrode 260 overlaps the notch portion 240 when viewed from the direction orthogonal to the main surface 212 of the insulating base 210.

As shown in FIG. 12, comparing the transmission characteristics according to the configuration shown in FIG. 9 and the transmission characteristics according to the configuration shown in FIG. 10, it is understood that in the configuration shown in FIG. 9 in which the center line 240A of the notch portion 240 coincides with the center line 260A of the first electrode 260 when viewed from the direction orthogonal to the main surface 212 of the insulating base 210, there is no large dip even in the transmission over 40 GHz and stable transmission can be performed. Therefore, from the viewpoint of stable signal transmission, it is desirable that the center line 240A of the notch portion 240 and the center line 260A of the first electrode 260 coincide with each other as shown in FIG. 9.

On the other hand, with the configuration shown in FIG. 10, since the allowable range for the position where the notch portion 240 is disposed increases, the degree of freedom of component mounting on the printed circuit board 200 increases. Therefore, it can be said that the configuration shown in FIG. 10 is more desirable than the configuration shown in FIG. 9 from the viewpoint of the degree of design freedom regarding component mounting on the printed circuit board 200. That is, the configuration shown in FIG. 10 can be said to be a configuration that realizes both the stability of transmission and the degree of freedom of component mounting.

Figure 13:
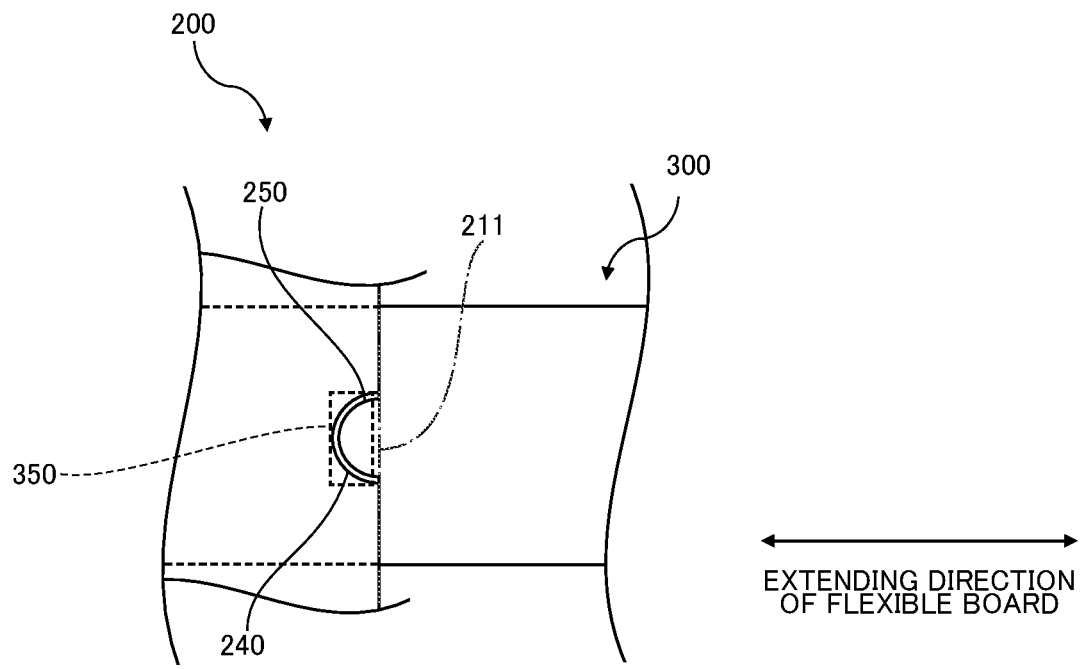
FIG. 13 is a schematic plan view in which an overlapping portion of a notch portion and a third electrode is enlarged.

FIG. 13 is a schematic plan view in which the overlapping portion of the notch portion 240 and the third electrode 350 according to the present implementation is enlarged. As shown in FIG. 13, in the extending direction of the insulating sheet 310, the entire third electrode 350 is disposed at the same position on the printed circuit board 200 as the side surface 211 where the notch portion 240 is formed or on an inner side of the printed circuit board 200 further than the side surface 211. In FIG. 13, the entire third electrode 350 is disposed on the inner side of the printed circuit board 200 further than the side surface 211 in the extending direction of the insulating sheet 310. By adopting such a configuration, the following advantages can be obtained.

First, the flexible board 300 has a role of absorbing variations in the overall length of the optical module 1. The flexible board 300 has a role of absorbing stress generated on the printed circuit board 200 side and suppressing transmission of the stress to the optical subassembly 100. In the present implementation, as shown in FIGS. 5 and 7, by adopting a configuration in which the entire third electrode 350 is disposed at the same position as the side surface 211 or on the inner side of the printed circuit board 200 further than the side surface 211 in the extending direction of the insulating sheet 310, due to the presence of the solder 74, the influence of the loss of flexibility in the extending direction of the insulating sheet 310 on the flexible board 300 can be reduced and the loss of the two roles described above can be suppressed.

The optical module 1 according to the present implementation as described above can be manufactured through the following manufacturing process.

An in-process printed circuit board including the insulating base 210, the first transmission line 220 provided on the insulating base 210, the first ground conductor 230 disposed in the insulating base 210, and the first electrode 260 exposed on the main surface 212 of the insulating base 210 facing the flexible board 300 and electrically connected to the first transmission line 220 is prepared.

Next, as shown in FIGS. 2 and 3, the notch portion 240 that exposes a part of the first ground conductor 230 from the side surface 211 of the insulating base 210 is formed.

Thereafter, the conductor 250 that is electrically connected to the first ground conductor 230 is formed at the notch portion 240. In a case where the first ground conductor 230 includes a plurality of ground conductors, the plurality of ground conductors are electrically connected to each other by forming the conductor 250.

A process for preparing the flexible board 300 is performed in parallel with or before and after the three processes of a process of preparing the in-process printed circuit board described above, a process of forming the notch portion 240, and a process of forming conductor 250. That is, the order of the above three processes and the process of preparing the flexible board 300 is not limited. In the process of preparing the flexible board 300, as shown in FIGS. 2 and 3, the flexible board 300 including the insulating sheet 310 including a plurality of insulating layers 311, 312, and 313, the second transmission line 320 provided on the insulating sheet 310, the second ground conductor 330 disposed in the insulating sheet 310, the second electrode 340 exposed on the main surface 314 of the insulating sheet 310 facing the printed circuit board 200 and connected to the second transmission line 320, and the third electrode 350 exposed on the main surface 314 of the insulating sheet 310 and connected to the second ground conductor 330 is prepared.

Thereafter, as shown in FIG. 5, the upper surface of the printed circuit board 200 is mounted on the back-surface side of the flexible board 300. At that time, when viewed from the direction orthogonal to the main surface 212 of the printed circuit board 200, the flexible board 300 and the printed circuit board 200 are disposed so that at least a part of the third electrode 350 electrically connected to the second ground conductor 330 in the flexible board 300 overlaps at least a part of a region surrounded by the conductor 250 and the side surface 211.

As shown in FIG. 5, the solder 74 is applied from the conductor 250 of the printed circuit board 200 to the third electrode 350 of the flexible board 300, and the conductor 250 and the third electrode 350 are electrically connected.

By such a manufacturing process, the optical module 1 according to the present implementation described above can be manufactured.

It is possible to suppress a change in impedance caused by ground connection between the printed circuit board 200 and the flexible board 300 by using such a manufacturing method. That is, when the printed circuit board 200 and the flexible board 300 are connected to the ground, for example, in a case where heat is applied from the insulating layer 311 (see FIG. 4) side of the flexible board 300 in order to melt the solder disposed between the two, a part of the insulating layer 311 may be peeled off due to the heat. When a part of the insulating layer 311 is peeled off, voids may be generated in the insulating layer 311, the dielectric constant in the insulating layer 311 may change, and the impedance may change. However, with the above manufacturing method, the conductor 250 and the third electrode 350 can be electrically connected by the solder 74 without applying such heat from the insulating layer 311 side. As a result, a change in impedance caused by ground connection between the printed circuit board 200 and the flexible board 300 can be suppressed.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method for manufacturing an optical module comprising:
    preparing a printed circuit board including:
        an insulating base,
        a first transmission line provided on the insulating base,
        a first ground conductor disposed in the insulating base, and
        a first electrode exposed on a main surface of the insulating base facing a flexible board and electrically connected to the first transmission line;
    forming a notch portion on a side surface of the insulating base such that the first ground conductor is partially exposed from the side surface;
    forming a conductor electrically connected to the first ground conductor at the notch portion;
    preparing the flexible board including:
        an insulating sheet including a plurality of insulating layers,
        a second transmission line provided on the insulating sheet,
        a second ground conductor disposed in the insulating sheet,
        a second electrode exposed on a main surface of the insulating sheet facing the printed circuit board and connected to the second transmission line, and
        a third electrode exposed on the main surface of the insulating sheet facing the printed circuit board and connected to the second ground conductor;
    disposing the flexible board and the printed circuit board so that at least a portion of the third electrode overlaps at least a portion of a region surrounded by the conductor and the side surface when viewed from a direction orthogonal to the main surface of the insulating base; and
    applying solder from the conductor to the third electrode.

2. The method of claim 1, wherein the notch portion and the conductor constitute a castellation.

3. The method of claim 1, wherein the first ground conductor is composed of a plurality of ground conductors.

4. The method of claim 1, wherein the third electrode is a portion of the second ground conductor exposed from the insulating sheet.

5. The method of claim 1, wherein a center line of the first electrode overlaps the notch portion when viewed from the direction orthogonal to the main surface of the insulating base.

6. The method of claim 1, wherein a center line of the notch portion and a center line of the first electrode do not coincide with each other when viewed from the direction orthogonal to the main surface of the insulating base.

7. The method of claim 1, wherein a center line of the notch portion and a center line of the first electrode coincide with each other when viewed from the direction orthogonal to the main surface of the insulating base.

8. The method of claim 1, wherein an entirety of the third electrode is disposed at a same position as the side surface or on an inner side of the printed circuit board further than the side surface in an extending direction of the insulating sheet.

9. The method of claim 1, wherein the first ground conductor has an opening at a position overlapping the first electrode when viewed from the direction orthogonal to the main surface of the insulating base.

10. The method of claim 1, wherein the conductor and the third electrode are orthogonal to each other, and
    wherein the solder forms a fillet.

11. The method of claim 1, wherein the printed circuit board further includes a resist applied to the main surface of the insulating base and the first transmission line.

12. The method of claim 11, wherein a portion of the first transmission line is exposed from an opening of the resist.

13. The method of claim 12, wherein the portion of the first transmission line exposed from the opening is used as the first electrode.

14. The method of claim 1, wherein the first electrode and the second electrode are electrically connected by a solder filling a via provided in the second electrode.

15. The method of claim 1, wherein the printed circuit board further includes a fourth electrode connected to the first ground conductor.

16. The method of claim 15, wherein the printed circuit board further includes:
    a resist applied to the main surface of the insulating base,
        wherein a portion of the first ground conductor, exposed from an opening of the resist, is used as the fourth electrode.

17. The method of claim 15, wherein the flexible board further includes:
    a fifth electrode connected to the second ground conductor,
        wherein the fourth electrode and the fifth electrode are electrically connected.

18. The method of claim 17, wherein the fourth electrode and the fifth electrode are electrically connected by a solder filling a via provided in the fifth electrode.

19. The method of claim 1, wherein an outermost layer, of the plurality of insulating layers, comprises an opening,
    wherein a portion of the second ground conductor is exposed from the opening.

20. The method of claim 19, wherein the portion of the second ground conductor exposed from the opening is used as the third electrode.

* * * * *